US006558870B1

(12) United States Patent
Kawahara et al.

(10) Patent No.: US 6,558,870 B1
(45) Date of Patent: May 6, 2003

(54) WATER-WASHABLE PHOTOSENSITIVE FLEXO PLATE AND PRINTING PLATE

(75) Inventors: Keizo Kawahara, Shiga (JP); Yasuyuki Okazaki, Shiga (JP); Hiroshi Satomi, Shiga (JP); Tohru Wada, Shiga (JP)

(73) Assignee: Toyo Boseki Kabushiki Kaisha, Osaka (JP)

(*) Notice: Subject to any disclaimer, the term of this patent is extended or adjusted under 35 U.S.C. 154(b) by 0 days.

(21) Appl. No.: 09/598,695

(22) Filed: Jun. 21, 2000

(30) Foreign Application Priority Data

| | | |
|---|---|---|
| Jun. 23, 1999 | (JP) | 11-177024 |
| Jun. 23, 1999 | (JP) | 11-177025 |
| Jun. 23, 1999 | (JP) | 11-177026 |

(51) Int. Cl.[7] ........ G03F 7/004

(52) U.S. Cl. ........ 430/270.1; 430/306

(58) Field of Search ........ 430/306, 18, 270.1

(56) References Cited

U.S. PATENT DOCUMENTS

| | | | | | |
|---|---|---|---|---|---|
| 4,332,873 | A | * | 6/1982 | Huges et al. | 430/18 |
| 4,638,758 | A | * | 1/1987 | Bloothoofd | 430/935 |
| 5,238,783 | A | * | 8/1993 | Taniguchi et al. | 430/138 |
| 5,688,632 | A | * | 11/1997 | Kashio et al. | 430/281.1 |
| 5,976,765 | A | * | 11/1999 | Kumpfmiller et al. | 430/306 |

FOREIGN PATENT DOCUMENTS

| | | | |
|---|---|---|---|
| EP | 0 452 656 | A | 10/1991 |
| JP | 05 249668 | A | 9/1993 |
| JP | 09 080743 | A | 3/1997 |

* cited by examiner

*Primary Examiner*—John S. Chu

(57) ABSTRACT

A water-washable photosensitive flexo plate capable of reproducing images of a level as defined by a halftone resolution of 1% to 95% at 200 lines/inch, a minimum isolated dot having a diameter of 100 μm, and by a minimum isolated line having a width of 30 μm.

8 Claims, No Drawings

WATER-WASHABLE PHOTOSENSITIVE FLEXO PLATE AND PRINTING PLATE

TECHNICAL FIELD OF THE INVENTION

The present invention relates to a water-washable photosensitive flexo plate superior in image reproducibility.

BACKGROUND OF THE INVENTION

The flexo printing has been conventionally employed in a broad range of use, because it is advantageous in terms of environmental hygiene, it only requires a simple printer and it achieves high productivity, due to the use of water-based ink and alcohol-based ink having low viscosity. When compared to relief printing, lithographic printing, gravure printing and the like, wherein oil-based ink is used, however, the flexo printing shows poor image reproducibility. Therefore, an improvement in the image reproducibility is required for the flexo printing.

A printing plate to be used for the flexo printing is made from a material having rubber elasticity and is characteristically thick, for example, 1 mm–7 mm.

When the printing plate comes into contact with a printing material for the transfer of ink thereon during printing, therefore, the printing plate deforms and the printed images may be enlarged as compared to the original images: the occurrence of so-called dot-gain.

In addition, since a flexo printing plate is thicker than a relief printing plate or a lithographic printing plate, for which oil-based ink is used, the light necessary for forming images cannot permeate sufficiently through to the inside of the plate. This results in poor image reproducibility.

SUMMARY OF THE INVENTION

It is therefore an object of the present invention to provide a plate that can make a flexo printing plate superior in image reproducibility and in printability with smaller dot-gain in the flexo printing.

According to the present invention, there has now been provided a photosensitive flexo printing plate having high image reproducibility as achieved by making the dynamic hardness of a surface different from that of an inside of the printing plate, by making the hardness of a dot part different from that of a solid part, or by other means.

To be specific, the present invention provides a water-washable photosensitive flexo plate capable of reproducing images of a level as defined by the halftone resolution of 1% to 95% at 200 lines/inch, a minimum isolated dot having a diameter of 100 μm, and by a minimum isolated line having a width of 30 μm.

DETAILED DESCRIPTION OF THE INVENTION

The present invention will become clear by the following description.

The water-washable photosensitive flexo plate of the present invention characteristically reproduces images of the level as defined by a halftone resolution of 1% to 95% at 200 lines/inch, a minimum isolated dot having a diameter of 100 μm, and by a minimum isolated line having a width of 30 μm.

Preferably, the water-washable photosensitive flexo plate of the present invention has at least a support base and a photosensitive resin layer, the photosensitive resin layer comprising an ethylenically unsaturated compound and having a sea-island type phase structure consisting of an island component and a sea component, wherein the ethylenically unsaturated compound is contained in a greater amount in the sea component than in the island component.

More preferably, the above-mentioned ethylenically unsaturated compound has a molecular weight of not more than 500.

The photosensitive flexo printing plate having the image reproducibility of the present invention can be obtained by (1) setting the ratio (A)/(B) of the dynamic hardness (A) of the surface of a water-washable photosensitive flexo printing plate and the dynamic hardness (B) of the inside of the printing plate to not less than 1.1; (2) setting, in a water-washable photosensitive flexo printing plate, the ratio (C)/(D) of the dynamic hardness (C) of the surface of dots having a density (proportion of the area occupied by dots per unit area) of not more than 50% and the dynamic hardness (D) of the surface of the solid part having a density of 100% to not less than 1.1; (3) decreasing scattering of light at a wavelength necessary for forming images; or by other method.

The water-washable photosensitive flexo plate of the present invention preferably consists of at least a support base and a photosensitive resin layer. The support base usable for the plate of the present invention is not particularly limited, and is exemplified by a polyester film, preferably a polyethylene terephthalate film. The support base has a thickness of preferably 10 μm–500 μm, more preferably 50 μm –400 μm. The photosensitive resin layer usable for the plate of the present invention can be made from a photosensitive resin composition. The photosensitive resin layer has a thickness of preferably 50 μm–20000 μm, more preferably 100 μm–1000 μm.

By the water-washable photosensitive flexo printing plate of the present invention is meant the above-mentioned flexo plate after exposure and development to remove non-imaged parts.

In the above-mentioned (1), the dynamic hardness of the surface of the printing plate is that measured for the part of from the outermost surface of the printing plate to the depth of 0–10 μm, and the dynamic hardness of the inside of the printing plate is that measured for the part having a depth of not less than 11 μm from the outermost surface of the printing plate. In the above-mentioned (2), the dynamic hardness of the surface of dots having a density of not more than 50% is that measured for the part of from the outermost surface of the dots having a density of not more than 50% to the depth of 0–10 μm, and the dynamic hardness of the surface of the solid part having a density of 100% is that measured for the part of from the outermost surface of the solid part having a density of 100% to the depth of 0–10 μm. The dynamic hardness is measured using the dynamic ultra-microhardness tester DUH201 (SHIMADZU CORPORATION) that provides information of strength of the surface of a specimen, as described in SHIMADZU REVIEW, Vol. 50. No. 3 (1993. 12) 321.

In the above-mentioned (1), when the ratio (A)/(B) of the dynamic hardness (A) of the surface of a water-washable photosensitive flexo printing plate and the dynamic hardness (B) of the inside of the printing plate is not less than 1.1, the surface of the printing plate has a higher hardness than in the inside, and does not permit deformation because the difference in the hardness produces a cushioning effect. Consequently, ink is transferred to a printing material, faithfully reproducing the shape of the printing plate and minimizing the dot-gain peculiar to the flexo printing, while providing a sharp print. The preferable range of the above-mentioned ratio (A)/(B) is 1.1–50.0, more preferably 1.1–30.0. When this ratio (A)/(B) of the dynamic hardness is less than 1.1, the aforementioned cushioning effect becomes void, and the surface of a printing plate deforms during printing to produce large dot-gain, unpreferably impairing sharp details of printed images.

In the above-mentioned (1), the ratio (A)/(B) of the dynamic hardness (A) of the surface of a water-washable photosensitive flexo printing plate and the dynamic hardness (B) of the inside of the printing plate can be set to not less than 1.1 by, for example, but not limited to, changing the crosslinking density of a photosensitive resin composition constituting the photosensitive resin layer, between the surface and the inside of the printing plate.

One method of changing the crosslinking density of the surface and the inside of a printing plate comprises employing a phase structure, which shows the distribution state of a photosensitive resin composition, of a sea-island type phase separation structure consisting of a sea component and an island component, and utilizing a difference in the solubility of crosslinkable components in the respective sea and island components, thereby creating a difference in the hardness.

In the above-mentioned (2), when the ratio (C)/(D) of the dynamic hardness (C) of the surface of the dots and the dynamic hardness (D) of the surface of the solid part is not less than 1.1, the ink in the solid part can be transferred well by the application of a low printing pressure, and the dot part is printed vividly without being crushed. As a result, a print as a whole shows superior balance. The preferable range of the above-mentioned ratio (C)/(D) is 1.1–50.0, more preferably 1.1–30.0. When this ratio (C)/(D) of the dynamic hardness is less than 1.1, the dot part is crushed by printing, thus failing to provide a vivid print.

In the above-mentioned (2), the ratio (C)/(D) of the dynamic hardness (C) of the surface of the dots and the dynamic hardness (D) of the surface of the solid part is set to not less than 1.1 by, but not limited to, a method which comprises employing a phase structure, which shows the distribution state of a photosensitive resin composition, of a sea-island type phase separation structure consisting of a sea component and an island component, and utilizing a difference in the solubility of crosslinkable components in the respective sea and island components, thereby creating a difference in the hardness.

When the sea-island type phase structure is formed where the photosensitive resin composition consists of a non-crosslinkable compound, a component having a relatively low viscosity, which easily flows, takes a sea phase structure, as described in Polymer Alloy, edit. THE SOCIETY POLYMER SCIENCE, JAPAN, TOKYO KAGAKU DOJIN CO., LTD., p. 22 (1981). When the constituent components are a non-crosslinkable compound and a crosslinked compound, the non-crosslinkable compound having a relatively low viscosity, which easily flows, takes a sea phase structure, because the crosslinked compound does not dissolve in the non-crosslinkable compound.

In the sea-island structure, the outermost surface of a printing plate contains the sea component as the main component, and the inside of the printing plate has a greater content of the island component of the sea-island structure than the surface of a printing plate. When the crosslinked component easily dissolves in the sea component or the sea component itself is crosslinkable, the surface and the inside of a printing plate have a different hardness. In the present invention, the outermost surface of the printing plate has a high crosslinking density, making sensitivity higher, and high image reproducibility can be afforded as compared to conventional flexo printing plates.

As mentioned in the above, the photosensitive resin layer of the photosensitive flexo printing plate of the present invention having a sea-island structure may consist of a non-crosslinked compound and a crosslinked compound, or may consist of a non-crosslinkable compound upon phase separation.

The following explains the constitution comprising a non-crosslinked compound and a crosslinked compound.

The crosslinkable particulate hydrophilic or water-swellable elastomer is exemplified by partially and internally crosslinked one obtained by radical emulsion polymerization disclosed in JP-A-1-300246 and the like. The partially and internally crosslinked copolymer can be obtained by radical emulsion polymerization of a monomer mixture containing an aliphatic conjugated diene monomer (40–95 mol %) and a compound (0.1–10 mol %) having at least 2 addition polymerizable groups.

The aliphatic conjugated diene monomer as the aforementioned copolymerization component is exemplified by butadiene, isoprene, dimethylbutadiene, chloroprene and the like. Examples of the α,β-ethylenically unsaturated carboxylic acid include acrylic acid, maleic acid, fumaric acid, itaconic acid, protonic acid and the like. The compound having at least 2 addition polymerizable groups is exemplified by trimethylol propane di(meth)acrylate, trimethylol propane tri(meth)acrylate, divinylbenzene, ethylene glycol di(meth)acrylate, pentaerythritol tetra(meth)acrylate, 1,4-butanediol di(meth)acrylate, 1,6-hexanediol di(meth) acrylate and the like. The carboxyl group of α,β-ethylenically unsaturated carboxylic acid may form a salt with a basic nitrogen atom-containing compound, wherein a preferable basic nitrogen atom compound includes N,N-dimethylaminopropyl (meth)acrylamide, N,N-dimethylaminoethyl (meth)acrylamide, N,N-dimethylaminoethyl-N'-(meth)acryloylcarbamate, N,N-dimethylaminoethoxyethanol, N,N-dimethylaminoethoxyethyl (meth)acrylate and the like.

The crosslinkable particulate hydrophilic or water-swellable elastomer may be a core shell microgel binder shown in JP-A-2-175702 and the like. The core shell microgel binder used herein means particles having a core having a degree of crosslinking of not more than 10%, and a non-crosslinked external shell made from an acid-modified copolymer and treatable with an aqueous system. The monomer to form the core is exemplified by methyl methacrylate, ethyl acrylate, methacrylic acid, butyl methacrylate, ethyl methacrylate, glycidyl methacrylate, styrene and allyl methacrylate, and butanediol acrylate, ethylene glycol dimethacrylate, tetramethylene glycol diacrylate, trimethylolpropane triacrylate, tetramethylene glycol dimethacrylate and the like as crosslinking agents. The acid-modified copolymer to form the shell is preferably exemplified by methacrylic acid-modified n-butyl acrylate. The core shell microgel binder is generally produced by emulsion polymerization of these monomers.

Besides the aforementioned, examples of the crosslinkable particulate hydrophilic or water-swellable elastomer include latex disclosed in JP-A-6-289610 and the like. This latex can be obtained by emulsion polymerization of a monomer mixture consisting of a monoolefinic unsaturated monomer and an unsaturated monomer having a hydrophilic functional group. Examples of the monoolefinic unsaturated monomer include acrylate esters such as methyl acrylate, ethyl acrylate, n-butyl acrylate, 2-ethylhexyl acrylate, n-octyl acrylate, dodecyl acrylate, methoxyethyl acrylate, ethoxyethyl acrylate, cyanoethyl acrylate, hydroxyethyl acrylate, hydroxypropyl acrylate and the like, methacrylate esters thereof and the like. Other monoolefinic unsaturated monomers include styrene, acrylonitrile, vinyl chloride, ethylidenenorbornene, propenylnorbornene, dicyclopentadiene and the like. Where the case demands, a conjugated diene type monomer such as 1,3-butadiene, isoprene, chloroprene, 1,3-pentadiene and the like may be used, or a multifunctional vinyl compound may be introduced for improved crosslinking. Examples of the hydrophilic functional group include carboxyl group, phosphoric acid group, phosphate ester group, sulfonic acid group, hydroxyl group and the like, with particular preference given to phosphate ester group in view of washing out.

The aforementioned phosphate ester group-containing unsaturated monomer is exemplified by ethylene phosphate (meth)acrylate, trimethylene phosphate (meth)acrylate, propylene phosphate (meth)acrylate, tetramethylene phosphate (meth)acrylate, (bis)ethylene phosphate (meth)acrylate, (bis)trimethylene phosphate (meth)acrylate, (bis) tetramethylene phosphate (meth)acrylate, diethylene glycol phosphate (meth)acrylate, (bis)triethylene glycol phosphate (meth)acrylate, (bis)polyethylene glycol phosphate (meth) acrylate and the like.

In the following embodiment, the photosensitive resin layer is formed by phase separation of a non-crosslinkable compound.

The non-crosslinkable particulate hydrophilic or water-swellable elastomer is exemplified by particles having a phase comprising, as the main component, a hydrophobic polymer disclosed in JP-A-3-72353 and the like and a phase comprising a hydrophilic polymer as the main component. The hydrophobic polymer constituting the particles may be a polymer obtained by polymerization of a conjugated diene type hydrocarbon, a copolymer obtained by polymerization of a conjugated diene type hydrocarbon and a monoolefinic unsaturated compound, a polymer without a conjugated diene type hydrocarbon, and the like. The hydrophilic polymer forming a phase mainly surrounding the particles may be a polymer having a hydrophilic group, such as hydroxyl group, carboxyl group, amino group, sulfonic acid group and the like, and/or a polyethylene glycol chain.

The polymer obtained by polymerization of a conjugated diene type hydrocarbon forming a phase comprising a hydrophilic polymer as the main component, and the copolymer obtained by polymerization of a conjugated diene type hydrocarbon and a monoolefinic unsaturated compound are exemplified by butadiene polymer, isoprene polymer, chloroprene polymer, styrene-butadiene copolymer, styrene-isoprene copolymer, styrene-chloroprene copolymer, acrylonitrile-butadiene copolymer, acrylonitrile-isoprene copolymer, methyl methacrylate-butadiene copolymer, methyl methacrylate-isoprene copolymer, methyl methacrylate-chloroprene copolymer, methyl acrylate-butadiene copolymer, methyl acrylate-isoprene copolymer, methyl acrylate-chloroprene copolymer, acrylonitrile-butadiene-styrene copolymer, acrylonitrile-chloroprene-styrene copolymer and the like.

Examples of the polymer without a conjugated diene type hydrocarbon forming a phase comprising a hydrophobic polymer as the main component include an elastomer containing a specific amount of chlorine and a non-conjugated diene type hydrocarbon, that are specifically exemplified by an epichlorohydrin polymer, an epichlorohydrin-ethylene oxide copolymer, an epichlorohydrin-propylene oxide copolymer, epichlorohydrin rubbers [Epichlomer manufactured by OSAKA SODA CO., LTD., HYDRIN manufactured by Goodvich, GECHRON ZEOSPAN manufactured by Nippon Zeon Co., Ltd., HERCLOR manufactured by Hevcules], that are copolymers of these and an acryl glycidyl ether, chlorinated polyethylene [ELASLEN manufactured by SHOWA DENKO K.K., DAISOLAC manufactured by OSAKA SODA CO., LTD., HORTALITZ manufactured by Hoechst, Dow CPE manufactured by Dow Chemical] and the like.

These hydrophobic polymers may be used alone or in combination. Its content in the photosensitive resin composition is preferably not less than 20 wt % and not more than 80 wt %. When it is not more than 20 wt %, the handling property is noticeably degraded, and when it is not less than 80 wt %, water washability is degraded. A particularly preferable content is not less than 30 wt % and not more than 70 wt %.

Examples of the hydrophilic polymer forming a phase containing a hydrophilic polymer as the main component are, but not limited to, polyvinyl alcohol, carboxymethyl cellulose, hydroxyethyl cellulose, water-soluble polyurethane, water-soluble polyureaurethane, water-soluble polyester, water-soluble epoxy compound, carboxyl group-containing acrylonitrile-butadiene copolymer, carboxyl group-containing styrene-butadiene copolymer, carboxyl group-containing polybutadiene, polyacrylamide, sodium polyacrylate, carboxyl group-containing polyureaurethane, polyamic acid and the like.

The above-mentioned photosensitive resin composition preferably undergoes phase separation during addition and mixing of each component to form a continuous phase and a dispersed phase. The content of the hydrophilic polymer in the photosensitive resin composition is not less than 1 wt % and not more than 40 wt %, preferably not less than 2 wt % and not more than 30 wt %, particularly preferably not less than 3 wt % and not more than 20 wt %, in view of water washability and water-based ink resistance.

With regard to the above-mentioned particulate hydrophilic or water-swellable elastomer, the content of the water-swellable elastomer in the entire photosensitive resin composition is preferably not less than 20 wt % and not more than 80 wt %, more preferably not less than 30 wt % and not more than 70 wt %. When it is less than 20 wt %, the developing property, shape retention and the like become insufficient, and when it exceeds 80 wt %, water resistance becomes insufficient.

In the present invention, the crosslinking density of the surface of a printing plate is preferably increased by adding a given amount of a specific ethylenically unsaturated compound to a photosensitive resin composition.

The specific ethylenically unsaturated compound in the present invention is a compound having a molecular weight of not more than 500 and having at least 2 ethylenically unsaturated groups at the terminal or on the side chain.

Examples of such specific ethylenically unsaturated compound include ethylene glycol di(meth)acrylate, diethylene glycol di(meth)acrylate, 1,4-butanediol di(meth)acrylate, 1,6-hexanediol di(meth)acrylate, trimethylolpropane tri (meth)acrylate, glycerin di(meth)acrylate, triethylene glycol di(meth)acrylate, PEG #200 di(meth)acrylate, PEG #400 di(meth)acrylate, 1,3-butanediol dimethacrylate, neopentyl glycol di(meth)acrylate, 1,10-decanediol dimethacrylate, di(meth)acrylate of ethylene oxide adduct with bisphenol A, ethylene oxide-modified trimethylolpropane triacrylate, pentaerythritol triacrylate, pentaerythritol tetraacrylate, dipentaerythritol hexaacrylate, 1, 9-nonanediol di(meth) acrylate, LIGHT ESTER P-2M (manufactured by KYOEISHA CO., LTD.), triacrylate of a 3 mol ethylene oxide adduct with pentaerythritol, oligopropylene glycol di(meth) acrylate, polytetramethylene glycol di(meth)acrylate and the like, with particular preference given to alkylene glycol type and alkylene ether type crosslinking agents.

Such specific ethylenically unsaturated compounds, due to small molecular weights they have, tend to be distributed in the sea component having lower viscosity and relatively greater fluidity in the sea-island structure of the aforementioned photosensitive resin layer. As a result, the specific ethylenically unsaturated compound is contained in greater amounts in the surface of a printing plate, which contains a greater amount of the sea component, than in the inside of the printing plate, thus making the crosslinking density greater than in the inside of the printing plate. In this way, the difference in the dynamic hardness between the surface and the inside of a printing plate, which is characteristic of the present invention, is achieved. Simultaneously, the photosensitive resin layer as a whole, which constitutes the printing plate, achieves a markedly higher sensitivity because the content of the specific ethylenically unsaturated compound is greater in the surface of a printing plate. Consequently, the high image reproducibility characterizing the present invention, which is unavailable with conventional flexo printing plates, can be achieved.

For the specific ethylenically unsaturated compound to be distributed in the surface of a printing plate, its content in the photosensitive resin layer is preferably in the range of 0.5 wt %–10 wt %, particularly 1–9 wt %.

When the content exceeds this range, the dynamic hardness of the surface of a solid part becomes greater, which necessitates application of a printing pressure for fine printing of the solid part. As a result, the dots are crushed, making vivid prints unavailable.

Further, when the content exceeds this range, the difference in the dynamic hardness between the surface and the inside of a printing plate, or between the dot part and the solid part becomes smaller, leading to a less cushioning effect during printing. When the content is smaller than this range, the surface of a printing plate has smaller crosslinking density, and the surface of a printing plate unpreferably deforms during printing.

In the present invention, the aforementioned specific ethylenically unsaturated compound can be concurrently used with a compound having a molecular weight of not less than 1000 and having an ethylenically unsaturated group in the terminal or on a side chain.

Examples thereof include, but not limited to, oligobutadiene (meth)acrylate, oligostyrene butadiene (meth)acrylate, oligonitrile butadiene (meth)acrylate, oligoisoprene (meth) acrylate, oligobutadiene urethane (meth)acrylate, oligostyrene butadiene (meth)acrylate, oligobutadiene amide (meth) acrylate and the like, disclosed in JP-A-1-219833 and the like.

The compound having a molecular weight of not less than 1000 and having an ethylenically unsaturated group can be mixed with the aforementioned specific ethylenically unsaturated compound at a desired ratio.

The above-mentioned photosensitive resin composition can further contain an initiator. Examples of the initiator include benzophenone, acetophenone, α-diketone, acyloin, acyloin ether, benzylalkylketal, polynuclear quinone, thioxanthone, acylphosphine and the like, which are specifically benzophenone, chlorobenzophenone, acetophenone, benzil, diacetyl, benzoin, benzoin methyl ether, benzoin ethyl ether, benzyldiethylketal, benzyldiisopropylketal, anthraquinone, 1,4-naphthoquinone, 2-chloroanthraquinone, thioxanthone, 2-chlorothioxanthone, acylphosphine oxide and the like. These can be used alone or in combination. The initiator is preferably contained in the photosensitive resin composition in a proportion of 0.01–10 wt %. When the amount is less than 0.01 wt %, it cannot function as an initiator, but when the amount exceeds 10 wt %, the initiator functions more as an internal filter, resulting in insufficient curing of the inside. More preferable content is 0.5–5 wt %.

The foregoing explanation has focused on a photosensitive resin composition having a continuous phase and a dispersed phase, wherein the hydrophilic or water-swellable elastomer has a dispersed phase (particulate) to increase the crosslinking density mainly by the use of a crosslinking agent (e.g., ethylenically unsaturated compound). This structure is not necessarily essential, and the system (composition) may be homogeneous. For example, EP-B-584970 discloses a homogeneous structure comprising an anionic polyurethaneurea.

In the present invention, the above-mentioned photosensitive resin composition may contain various other additives such as a thermal polymerization inhibitor, a plasticizer, a pigment and the like.

The water-washable photosensitive flexo printing plate of the present invention can be prepared by a conventional method. For example, the aforementioned photosensitive resin composition is sandwiched between a polyethylene terephthalate film having an adhesive layer, and a polyethylene terephthalate film having a slip coat layer (antitack layer) mainly prepared from a water-soluble resin, followed by heating and pressing the laminate.

The developing step of the water-washable photosensitive flexo plate of the present invention is explained in the following. The water-washable photosensitive flexo printing plate of the present invention can be obtained by placing a test negative on a plate, exposing the plate to ultraviolet rays under suitable exposure conditions and removing non-imaged parts using a developing solution. As the developing solution, water (pH 5.0–9.0) inclusive of general household water is most suitable. The water may contain an alkaline compound, a surfactant, a water-soluble organic solvent, an organic acid and the like. As the above-mentioned surfactant, sodium alkylnaphthalenesulfonate, sodium alkylbenzenesulfonate and the like are most suitable. Besides these, anionic surfactants, nonionic surfactants, and amphoteric surfactants can be used. The temperature of the developing solution is preferably 25–50° C.

The water-washable photosensitive flexo printing plate of the present invention, after the above-mentioned developing, is dried to remove water remaining on the surface of the printing plate, and subjected to post exposure for a typical printing plate. In this case, the convex parts of the printing plate are discontinuously and independently present in relation to the adjacent convex parts. The images of the dot part having a density of not more than 50% and the images of the solid part having a density of 100% have different areas in the continuous phase to be exposed to light during the post exposure, where the specific ethylenically unsaturated compound is locally present. That is, the area of the continuous phase to be cured by post exposure is greater in the images of the dots than in the images of the solid part, so as to increase the strength of the surface of a printing plate per unit printing area, due to an increased degree of crosslinking. Therefore, the dynamic hardness of the surface of the dot part of the printing plate of the present invention is greater than the dynamic hardness of the surface of the solid part. As a result, the flexo printing plate of the present invention capable of vivid printing can be obtained.

In the area where the dot density is not more than 50%, the convex parts producing the images are discontinuously and independently present in relation to the adjacent convex parts. Therefore, exposed parts and non-exposed parts are produced, where, due to a low probability of occurrence of termination reaction in the photo-radical reaction, the boundary part of the convex parts has a greater photo-curing degree. In the solid part having a density of 100%, the exposed parts and the non-exposed parts are borderless and the convex parts are continuously present. The solid parts have a greater probability of occurrence of termination reaction in the photo-radical reaction than the above-mentioned dot part, resulting in a smaller photo-curing degree. In the photosensitive resin composition of the present invention, the specific ethylenically unsaturated compound is locally present in the continuous phase. Thus, the difference in the photo-curing degrees between the dot part and the solid part becomes greater. This presumably produces a difference in the dynamic hardness of each surface, which is conducive to the reproduction of vivid images.

The present invention is explained in more detail in the following by referring to Examples. It is needless to say that the present invention is not limited to the Examples. In the Examples, "parts" means "parts by weight". The printing plates were evaluated by the following measurements.

1) Dynamic Hardness

Machine type: dynamic ultra-microhardness tester manufactured by SHIMADZU CORPORATION Test mode: soft material test (mode 3)

2) Specimen and Measurement of Dynamic Hardness

A flexo printing plate was obtained from a photosensitive flexo plate having a thickness of 1.70 mm by the use of a test negative having images having a halftone resolution of 1% to 95% at 200 lines/inch, a minimum isolated dot having a diameter of 100 μm, a minimum isolated line width of 30 μm, a minimum concave line width of 100 μm, a minimum convex letter of 1 point and a minimum concave letter of 1 point, solid images and a step guide, under plate making conditions of back exposure time achieving a depth of about 0.8 mm, minimum amount of exposure for a face exposure time achieving 300 μm slit width void depth of at least not less than 30 μm and reproducing dots having a density of 1% at 200 lines/inch, suitable developing, drying and post exposure curing. The obtained printing plate was measured for dynamic hardness of the outermost surface having a dot density of 10% at 150 lines/inch and the part 100 μm inside from the outermost surface of the cut-out section. The obtained printing plate was measured for dynamic hardness of the outermost surface having a dot density of 5% at 150 lines/inch and the outermost surface of the solid part having a density of 100%.

EXAMPLE 1

A solution of polytetramethylene glycol (29.0 parts, G-850 manufactured by HODOGAYA CHEMICAL CO., LTD.), dimethylol propionic acid (62.0 parts, FUJII GI TSUSHO), hexamethylene diisocyanate (119.0 parts, manufactured by NIPPON POLYURETHANE INDUSTRY CO., LTD.) and n-butyl tin dilaurate (5.0 parts) dissolved in tetrahydrofuran (300.0 parts) was placed in a 1 L flask equipped with a stirrer. The flask was heated to 65° C. with stirring, and the reaction was continued for 3 hr. Hydroxyethyl methacrylate (26.0 parts) was added and the mixture was reacted while heating to 65° C. for 2 hr. A solution of terminal amino group-containing acrylonitrile and butadiene oligomer (184.0 parts, Hycar ATBNX 1300×16, Ube Industries, Ltd.) dissolved in tetrahydrofuran (270.0 parts) in a separate container was added to the above-mentioned 1 L flask at room temperature with stirring. The obtained polymer solution was dried under reduced pressure to remove tetrahydrofuran, whereby a hydrophilic polymer [I] was obtained.

The above-mentioned hydrophilic polymer (10.5 parts), nitrile-butadiene rubber (33 parts, acrylonitrile 35%, NIPUL-1042, Nippon Zeon Co., Ltd.), butadiene rubber (22 parts, JSR BROLL), oligobutadiene acrylate (29 parts, PB-A, KYOEISHA CO., LTD.) and 1,6-hexanediol dimethacrylate (3 parts), and dimethylbenzylketal (2 parts) and hydroquinone monomethyl ether (0.1 part) as photoinitiators were kneaded with toluene (40 parts) and water (10 parts) in a heating kneader at 105° C., and toluene and water were evaporated under reduced pressure. The obtained photosensitive resin composition was sandwiched between a 125 μm thick polyethylene terephthalate film having a polyester type adhesive layer, and the same polyethylene terephthalate film (cover film) having an antitack layer (containing polyvinyl alcohol, propylene glycol and surfactant) applied thereon, so as to have the adhesive layer and the antitack layer in contact with the photosensitive resin composition. The laminate was heat-pressed with a heat press at 105° C. and 100 kg/cm$^2$ for 1 min, whereby a 1.7 mm thick flexo plate was prepared. The cover film of the obtained plate was released, a test negative having images having a halftone resolution of 1% to 95% at 200 lines/inch, a minimum isolated dot having a diameter of 100 μm, a minimum convex letter of 1 point and a minimum concave letter of 1 point, solid images and a step guide was placed thereon, back exposure and face exposure were performed using 365 nm light at illuminance of about 17.5 w/m$^2$ (lamp FR20T12-BL-9-BP manufactured by Anderson A Vreeland), the test negative was removed, and the plate was developed in neutral water containing sodium alkylnaphthalenesulfonate (4 wt %) at 40° C. for 12 min and dried at 60° C. for 20 min. Face exposure gave a printing plate.

The obtained printing plate had a relief depth of 0.8 mm, a halftone resolution of 1% to 95% at 200 lines/inch, a minimum isolated dot diameter of 100 μm, a minimum isolated line width of 30 μm, a minimum concave line width of 100 μm, a minimum convex letter of 1 point, and a minimum concave letter of 1 point, showing image reproducibility unavailable by conventional flexo printing plates. The dynamic hardness of the surface and inside of the obtained printing plate and the ratio thereof, and the dynamic hardness of the dots and the solid part of the printing plate and the ratio thereof are shown in Table 1 and Table 2.

As is evident from Table 1 and Table 2, the obtained printing plate was used to print with water-based ink to afford a print faithfully reproducing the original negative images.

EXAMPLE 2

In the same manner as in Example 1 except that dipentaerythritol hexaacrylate (3 parts) was used instead of 1, 6-hexanediol dimethacrylate (3 parts), a printing plate was obtained. The plate showed the same results as obtained in Example 1. The dynamic hardness of the surface and inside of the obtained printing plate and the ratio thereof, and the dynamic hardness of the dots and the solid part of the printing plate and the ratio thereof are shown in Table 1 and Table 2.

EXAMPLE 3

In the same manner as in Example 1 except that cis-isoprene rubber (33 parts, IR-10, KURARAY CO., LTD.) was used instead of nitrile-butadiene rubber (33 parts), a printing plate was obtained. The plate showed the same results as obtained in Example. The dynamic hardness of the surface and inside of the obtained printing plate and the ratio thereof, and the dynamic hardness of the dots and the solid part of the printing plate and the ratio thereof are shown in Table 1 and Table 2.

EXAMPLE 4

Isoprene rubber (21 parts, IR-310, SHELL JAPAN CO., LTD.), polybutadiene rubber (10.5 parts, JSR BROLL, JSR CO., LTD.), nitrile-butadiene rubber (4.5 parts, JSR230S, JSR CO., LTD.), liquid isoprene rubber (5.0 parts, LIR-410, KURARAY CO., LTD.), polybutadiene acrylate (30 parts, PB-A, KYOEISHA CO., LTD.), hydrophilic polymer [I] (10.5 parts), 1,6-hexanediol dimethacrylate (5 parts), benzyldimethylketal (2.0 parts) and hydroquinone monomethyl ether (0.1 part) were mixed in the same manner as in Example 1, and a printing plate was obtained. The plate showed the same results as obtained in Example 1. The dynamic hardness of the surface and inside of the obtained printing plate and the ratio thereof, and the dynamic hardness of the dots and the solid part of the printing plate and the ratio thereof are shown in Table 1 and Table 2.

EXAMPLE 5

Chlorinated polyethylene (45 parts, DAISOLAC H-135, DAISO CO., LTD.), butadiene rubber (14 parts, JSR BROLL, JSR CO., LTD.), oligobutadiene acrylate (25 parts, PB-A, KYOEISHA CO., LTD.), 1,6-hexanediol dimethacrylate (2.5 parts), dipentaerythritol hexaacrylate (2.5 parts), hydrophilic polymer [I] (10.5 parts), benzyldimethylketal (2 parts) and hydroquinone monomethyl ether (0.3 part) were mixed in the same manner as in Example 1, and a printing plate was obtained. The plate showed the same results as obtained in Example 1. The dynamic hardness of the surface and inside of the obtained printing plate and the ratio thereof, and the dynamic hardness of the dots and the solid part of the printing plate and the ratio thereof are shown in Table 1 and Table 2.

EXAMPLE 6

A phosphate ester group-containing random copolymer (40 parts, monomer composition: butadiene 65%, methyl acrylate 4%, ethylene phosphate methacrylate 20%, styrene 10%, divinylbenzene 1%), a polystyrene-polybutadiene-polystyrene type block copolymer (27 parts), liquid polybutadiene (25 parts, NISSO PBB1000), benzyldimethylketal (1 part) and 1,6-hexanediol dimethacrylate (7 parts) were melt kneaded in a heating kneader to give a photosensitive resin composition. The obtained photosensitive resin composition was processed to give a printing plate as in Example 1. The plate showed the same results as obtained in Example. The dynamic hardness of the surface and inside of the obtained printing plate and the ratio thereof, and the dynamic hardness of the dots and the solid part of the printing plate and the ratio thereof are shown in Table 1 and Table 2.

EXAMPLE 7

In the same manner as in Example 6 except that carboxyl group-containing core shell microgel [40 parts, core: copolymer of 2-ethylhexyl acrylate (89 parts), allyl acrylate (1 part) and 1,4-butanediol (8 parts), shell: copolymer of n-butyl acrylate (80 parts) and methacrylic acid (20 parts), core/shell reaction ratio 2/1] was used, a printing plate was obtained. The plate showed the same results as obtained in Example 6. The dynamic hardness of the surface and inside of the obtained printing plate and the ratio thereof, and the dynamic hardness of the dots and the solid part of the printing plate and the ratio thereof are shown in Table 1 and Table 2.

Comparative Example 1

In the same manner as in Example 1 except that 1,6-hexanediol dimethacrylate was not used, the same evaluation was performed. As a result, only image reproducibility showing a halftone resolution of 3% to 95% at 150 lines/inch, a minimum isolated dot diameter of 200 μm, a minimum isolated line width of 5 μm, a minimum concave line width of 150 μm, a minimum convex letter of 3 point, and a minimum concave letter of 4 point was obtained. The dynamic hardness of the surface and inside of the obtained printing plate and the ratio thereof, and the dynamic hardness of the dots and the solid part of the printing plate and the ratio thereof are shown in Table 1 and Table 2.

TABLE 1

| | dynamic hardness | | |
|---|---|---|---|
| | Surface (A) | Inside (B) | Ratio (A)/(B) |
| Ex. 1 | 0.20 | 0.05 | 4.0 |
| Ex. 2 | 0.21 | 0.08 | 2.6 |
| Ex. 3 | 0.20 | 0.06 | 3.3 |
| Ex. 4 | 0.25 | 0.05 | 5.0 |
| Ex. 5 | 0.18 | 0.09 | 2.0 |
| Ex. 6 | 0.23 | 0.07 | 3.3 |
| Ex. 7 | 0.21 | 0.06 | 3.5 |
| Com. Ex. 1 | 0.06 | 0.06 | 1.0 |

TABLE 2

| | dynamic hardness | | |
|---|---|---|---|
| | Dot (C) | Solid part (D) | Ratio (C)/(D) |
| Ex. 1 | 0.21 | 0.04 | 5.3 |
| Ex. 2 | 0.20 | 0.07 | 2.9 |
| Ex. 3 | 0.21 | 0.05 | 4.2 |
| Ex. 4 | 0.24 | 0.06 | 4.0 |
| Ex. 5 | 0.17 | 0.07 | 2.4 |
| Ex. 6 | 0.22 | 0.06 | 3.7 |
| Ex. 7 | 0.20 | 0.07 | 2.9 |
| Com. Ex. 1 | 0.05 | 0.05 | 1.0 |

As is clear from the foregoing explanation, the water-washable photosensitive flexo plate of the present invention has achieved high image reproducibility unavailable by conventional flexo printing and greatly contributes to the pertinent industrial field.

This application is based on application Nos. 177024/1999, 177025/1999 and 177026/1999 filed in Japan, the contents of which are incorporated hereinto by reference.

What is claimed is:

1. A water-washable photosensitive flexo printing plate comprising a support base and a photosensitive resin layer having a ratio (A)/(B) of not less than 1.1, wherein (A) is a dynamic hardness of a surface of the printing plate and (B) is a dynamic hardness of an inside of the printing plate.

2. A water-washable photosensitive flexo printing plate comprising a support base and a photosensitive resin layer having a ratio (C)/(D) of not less than 1.1, wherein (C) is a dynamic hardness of a surface of a dot part having a density of not more than 50% of the printing plate and (D) is a dynamic hardness of a surface of a solid part having a density of 100% of the printing plate.

3. The flexo printing plate of claim 1, wherein the resin layer has a variable density of crosslinking.

4. The flexo printing plate of claim 3, wherein the variable density of crosslinking is provided by a sea-island phase separation structure.

5. The flexo printing plate of claim 2, wherein the resin layer has a variable density of crosslinking.

6. The flexo printing plate of claim 5, wherein the variable density of crosslinking is provided by a sea-island phase separation structure.

7. The flexo printing plate of claim 1, wherein the photosensitive resin layer has a thickness of 100 μm to 1000 μm.

8. The flexo printing plate of claim 2, wherein the photosensitive resin layer has a thickness of 100 μm to 100 μm.

* * * * *